United States Patent [19]
Kuroda et al.

[11] Patent Number: 5,246,524
[45] Date of Patent: Sep. 21, 1993

[54] SEMICONDUCTOR WAFER PROCESSING SYSTEM

[75] Inventors: Shigeji Kuroda; Toshiyuki Sekido; Kazuhiro Noda; Matsuro Kinbara, all of Osaka, Japan

[73] Assignee: Nitto Denko Corporation, Osaka, Japan

[21] Appl. No.: 349,542

[22] Filed: May 9, 1989

[30] Foreign Application Priority Data

Jun. 6, 1988 [JP] Japan .................................. 63-140290

[51] Int. Cl.$^5$ ............................................. H01L 21/00
[52] U.S. Cl. .................................... 156/345; 156/626; 156/363; 156/510; 156/379.6; 198/347.1; 198/364; 198/365; 118/686; 118/35
[58] Field of Search ............... 156/345, 363, 364, 378, 156/379.6, 510, 626; 198/347.1, 363, 364, 365, 367; 134/133; 118/223, 668, 676, 686, 35

[56] References Cited

U.S. PATENT DOCUMENTS

| | | | |
|---|---|---|---|
| 1,908,487 | 5/1933 | Powers | 156/345 |
| 3,401,068 | 9/1968 | Benton | 156/345 |
| 3,522,942 | 8/1970 | Hepp | 198/358 |
| 3,620,879 | 11/1971 | Imamura et al. | 156/345 |
| 3,756,898 | 9/1973 | Frantzen et al. | 156/345 |
| 4,013,498 | 3/1977 | Frantzen et al. | 156/345 |
| 4,017,343 | 4/1977 | Haas | 156/345 |
| 4,772,357 | 9/1988 | Carlson et al. | 156/345 |
| 4,792,033 | 12/1988 | Iwata et al. | 198/358 |
| 4,895,107 | 1/1990 | Yano et al. | 118/719 |

FOREIGN PATENT DOCUMENTS 0140402 6/1986 Japan .................................. 198/372

Primary Examiner—Thi Dang
Attorney, Agent, or Firm—Sughrue, Mion, Zinn, Macpeak & Seas

[57] ABSTRACT

A semiconductor wafer processing system having a plurality of processing devices forming a base processing line for processing in sequence a workpiece having a semiconductor wafer is provided with an auxiliary loader connected to one of the processing devices for supplying the workpiece forming a processing line different from the base processing line, and an auxiliary unloader connected to the one processing device for receiving the workpiece processed by the one processing device at times when the one processing device is not supplied the workpiece by the processing device upstream of the one processing device in the base processing line.

6 Claims, 5 Drawing Sheets

SEMICONDUCTOR WAFER PROCESSING SYSTEM

BACKGROUND OF THE INVENTION

This invention relates to a semiconductor wafer processing system having a process line formed by a plurality of processing devices, and more particularly to a system where each processing device processes a semiconductor wafer bonded by an adhesive to a ring-shaped frame. The wafer bonded to the frame is referred to as a "workpiece" below.

A conventional semiconductor wafer processing system of this type is shown in FIG. 9. The system includes an automatic semiconductor wafer bonding device 1 with a wafer loader 1a and a frame loader 1b, a dicing device 2, an ultraviolet (UV) ray applying device 3, and a stacker 4. These processing devices 1 through 4 are connected in sequence in the stated order. The system further includes a host computer (not shown) for controlling movement of a wafer bonded to a frame hereinafter referred to as a workpiece W between these processing devices. UV ray applying device 3 subjects workpiece W to UV rays to reduce the adhesive strength between the semiconductor wafer bonded to workpiece W and the special adhesive tape used to bond the wafer to workpiece W. The adhesive tape is designed so that when the adhesive tape is exposed to UV rays, it loses the adhesive strength, thereby facilitating removal of a semiconductor chip out of the wafer in subsequent die bonding processes.

This type of conventional semiconductor wafer processing system suffers from several flaws, in that at times when one of upstream processing devices in the process flow breaks down, or one lot of workpieces is shifted with respect to another lot in automatic wafer bonding device 3, the movement of workpieces in the process line may be suspended. In other words, each downstream processing device will have a waiting time, resulting in low work efficiency.

Further, if any upstream processing device has a smaller processing capacity than a downstream processing device, the work efficiency of the system will be limited to the capacity of the upstream processing device. Upstream processing refers to early stages in the process sequence and downstream processing refers to later stages in the process sequence.

Further, in a conventional semiconductor wafer processing system, the orientation direction of the workpiece placed in the unloader may be different from the orientation direction of the workpiece as originally supplied from the loader, which makes handling of the workpiece difficult in subsequent processing step.

Furthermore, if a particular lot of workpieces is required to be processed out of turn, it would be difficult to allow such a lot to be inserted in the processing line.

SUMMARY OF THE INVENTION

In view of the foregoing, an object of this invention is to improve the work efficiency of the semiconductor wafer processing system.

Another object of the invention is to provide a semiconductor wafer processing system in which the orientation of a workpiece in the unloader remains unchanged from its position as in the loader The foregoing objects and other objects of the invention are achieved by a semiconductor wafer processing system which includes a plurality of processing devices forming a base processing line for processing in sequence a workpiece, a sensing device for detecting the supply of a workpiece to one of the processing devices, a first auxiliary device disposed adjacent the one processing device responsive to the sensing device for supplying a workpiece to the one processing device at times when the workpiece is not being supplied by another processing device upstream of the one processing device, and a second auxiliary device disposed adjacent the one processing device responsive to the sensing device for receiving the workpiece processed by the one processing device in a direction different than the direction of the base processing line extending between the one processing device and another processing device downstream of the one processing device at times when the workpiece is supplied by the first auxiliary device.

A typical function of the semiconductor wafer processing system of the present invention is as follows. Assuming that the same processing device described above is an UV ray applying device connected to an upstream dicing device, and no workpiece receiving request is issued to the UV ray applying device from the dicing device because the dicing device is inoperational. The first auxiliary device operates to supply a workpiece, which, for example, has a diced wafer prepared in advance, to the UV ray applying device through a processing line different from the base processing line. The workpiece, after being processed by the UV ray applying device, is delivered to the second auxiliary device through the processing line different from the base processing line. This operation can continue until the dicing device in the base processing line becomes operational and issues a workpiece receiving request to the UV ray applying device for normal operation in the base processing line.

In handling the workpiece having a diced wafer as described above, it is preferable that the direction of the workpiece orientation in the second auxiliary device be identical to the direction of the workpiece orientation as supplied from the first auxiliary device, to facilitate handling of the workpiece in subsequent processing steps.

The nature, principle and utility of the invention will become more apparent from the following detailed description when read in conjunction with the accompanying drawings.

DETAILED DESCRIPTION OF THE PREFERRED EMBODIMENTS

Preferred embodiments of this invention will be described with reference to the accompanying drawings in detail.

Figure 1:
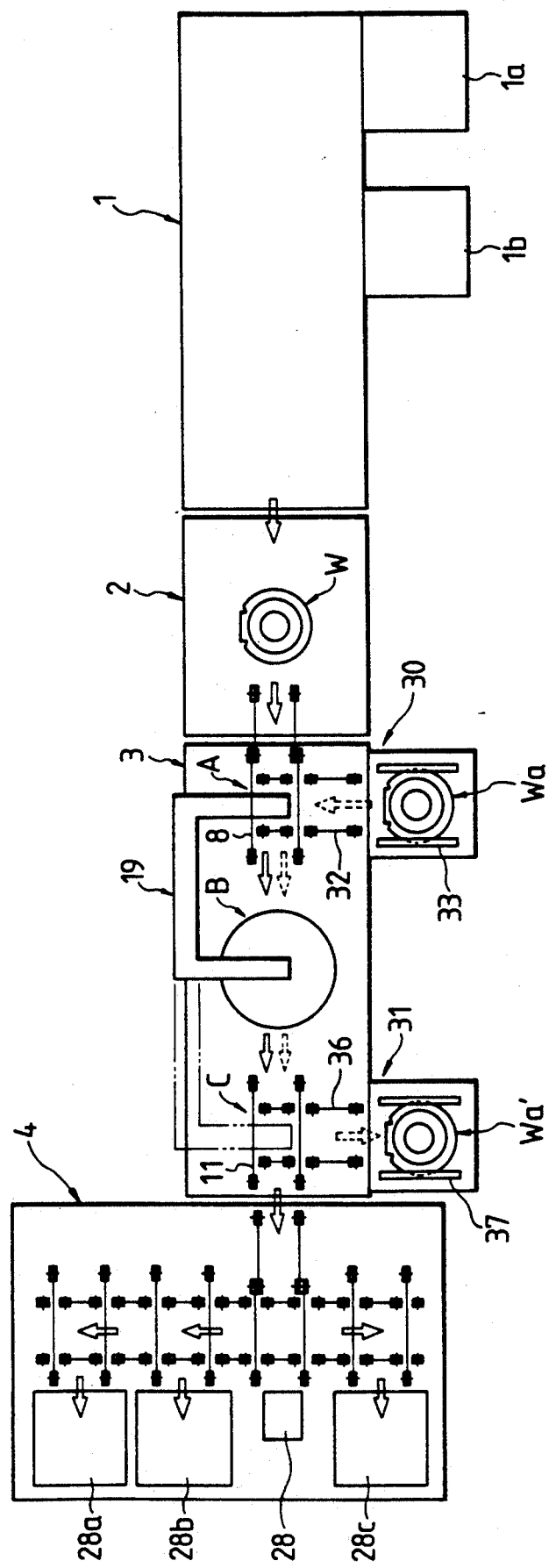
FIG. 1 is a plan view of a semiconductor wafer processing system according to a first embodiment of the present invention.

FIG. 1 shows a semiconductor wafer processing system according to a first embodiment of the present invention.

A semiconductor wafer bonding device 1, a dicing device 2, an ultraviolet (UV) ray applying device 3, and a stacker 4 are connected in sequence in the stated order, thus forming a base processing line for processing a semiconductor wafer in that sequence as shown in FIG. 1.

Figure 7:
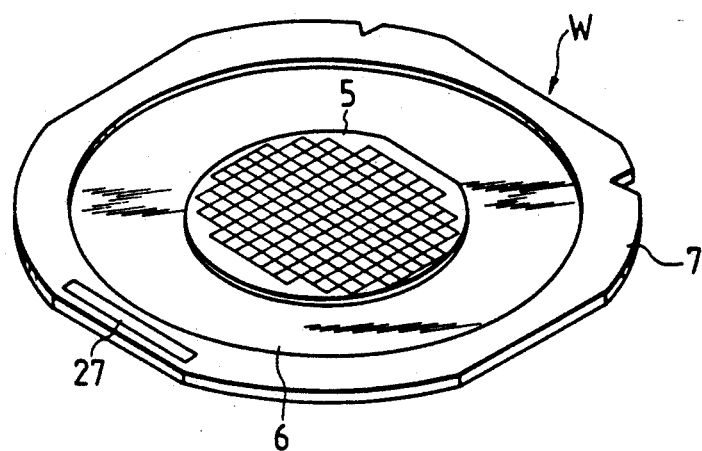
FIG. 7 is a perspective view of a workpiece used in the processing system of FIG. 1.

Semiconductor wafer bonding device 1 provides a workpiece W, as shown in FIG. 7. More specifically, device 1 receives a wafer 5 from a wafer loader 1a, and bonds an adhesive tape 6 which is larger than the wafer 5 to wafer 5 so that the wafer 5 is located in about a center position of the adhesive tape 6, and then bonds wafer 5 with adhesive tape 6 bonded thereon to a ring-shaped frame 7 which is received from a frame loader 1b.

Dicing device 2 cuts workpiece W along predetermined scribe lines, which operation is well known in the art. UV ray applying device 3 subjects diced workpiece W to UV rays from below workpiece W for reducing the adhesive strength between the adhesive tape and wafer 5.

Figure 3:
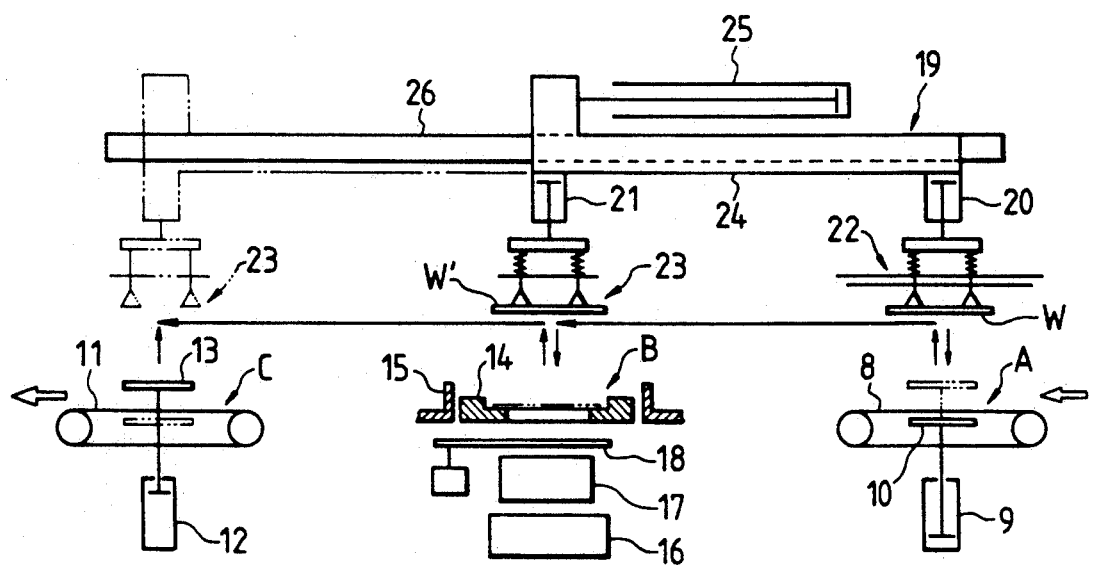
FIG. 3 is a sectional view of an ultraviolet ray applying device used in the processing system of FIG. 1.

FIG. 3 shows a section view of UV ray applying device 3. UV ray applying device 3 includes a workpiece receiving section A for receiving workpiece W from dicing device 2, an UV ray applying section B, and a workpiece unloading section C for delivering processed workpiece W' to stacker 4, which are connected in sequence in the stated order in accordance with the direction of process flow of the base processing line.

Workpiece receiving section A has workpiece receiving belts disposed in parallel with the direction of process flow of the base processing line and a workpiece placing stand 10 for placing workpiece W thereon. Workpiece placing stand 10 moves by an air cylinder upwardly or downwardly in a vertical direction with respect to the direction of process flow.

Workpiece conveying section C has workpiece unloading belts 11 extended along the direction of process flow, and a workpiece placing stand 13 which moves upwardly or downwardly in a vertical direction with respect to the direction of process flow by an air cylinder 12.

UV ray applying section B includes a ring-shaped workpiece supporting stand 14 for supporting the frame of workpiece W, a cylindrical housing 15 accommodating workpiece supporting stand 14, an UV lamp 16, an UV beam cylinder 17, and a shutter 18. UV lamp 16, UV beam cylinder 17, and shutter 18 are disposed below cylindrical housing 15.

A traverse mechanism 19 is provided to move workpiece W from workpiece receiving section A to UV ray applying section B, and from section B to workpiece unloading section C in the direction of process flow, while workpiece W is suspended in the air. Traverse mechanism 19 includes a movable frame 24 having a pair of workpiece suction and retaining mechanisms 22 and 23, and an air cylinder 25 for moving movable frame 24 on a guide rail 26 forwardly and backwardly in parallel with the direction of process flow.

Each of mechanisms 22 and 23 is disposed at a respective end of movable frame 24 and provides suction and retaining of workpiece W onto movable frame 24 for keeping workpiece W suspended in the air during the movement of workpiece W. Each of mechanisms 22 and 23 moves vertically with respect to the direction of process flow by a respective one of air cylinders 20 and 21.

Traverse mechanism 19 is designed so that the movement by workpiece suction and retaining mechanism 22 of workpiece W from workpiece receiving section A to UV ray applying section B is simultaneously accomplished by the movement by workpiece suction and retaining mechanism 23 of workpiece processed workpiece W' from UV ray applying section B to workpiece unloading section C.

Stacker 4 shown in FIG. 1 includes a bar code reader 28 for reading a bar code 27 (shown in FIG. 7) which is provided on processed workpiece W' delivered from workpiece unloading section C. Processed workpiece W' is delivered in response to read bar code 27 to a respective one of processed workpiece storing sections, for example, 28a, 28b and 28c, as shown in FIG. 1 and stored processed workpiece W' therein.

Figure 2:
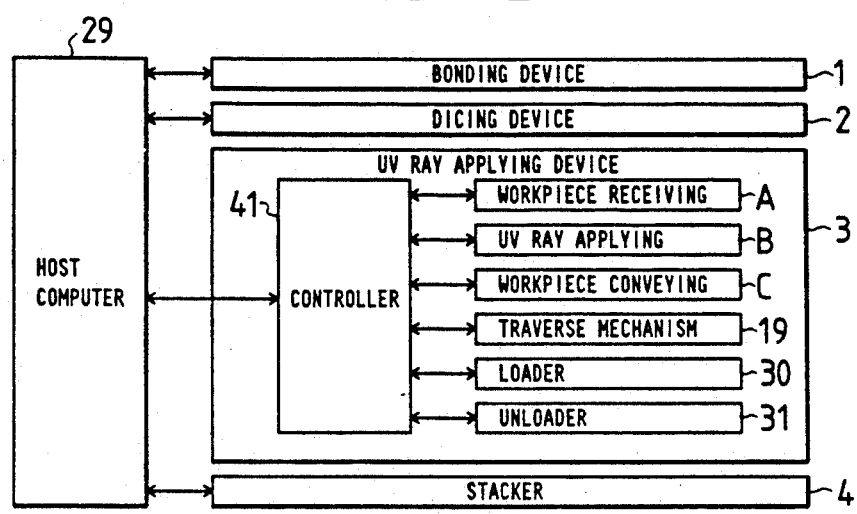
FIG. 2 is a schematic diagram of a control system used in the processing system of FIG. 1.

As discussed above, the processing devices described above form the base processing line for the semiconductor wafer processing system of the invention. The workpiece is removed between the processing devices in response to instructions from a host computer 29 according to a predetermined procedure as shown in FIG. 2.

According to a first embodiment of the present invention, in UV ray applying device 3, as shown in FIG. 1, workpiece receiving section A further includes a loader 30 which supplies workpiece Wa directly to receiving section A, thus forming a processing line different from the base processing line, and workpiece unloading section C further includes an unloader 31 for unloading processed workpiece Wa' from unloading section C to unloader 31, which, and storing workpiece Wa' therein, thus forming a processing line different from the base processing line. Therefore, UV applying device 3, together with loader 30 and unloader 31 connected thereto forms a processing line which is different from the base processing line.

Figure 4:
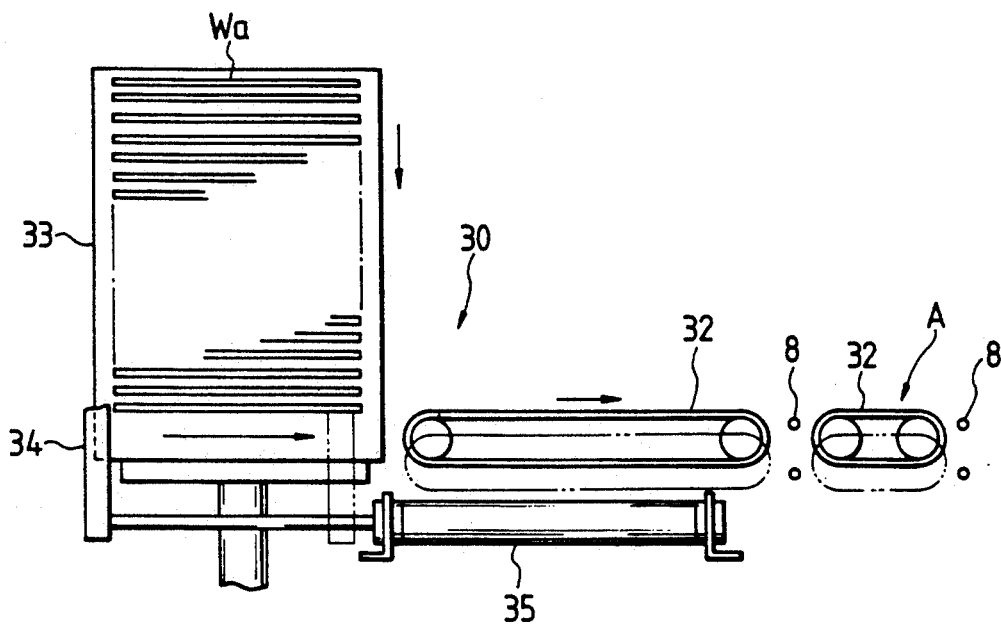
FIG. 4 is a sectional view of a loader used in the processing system of FIG. 1.

Loader 30, as shown in FIG. 4, includes supply belts 32 which move perpendicularly with respect to the movement of workpiece receiving belts 8, and normally are disposed below belts 8, and which move above belts 8 by air cylinders (not shown) at times when belts 32 are operational, a cassette 33 disposed movably vertically with respect to the movement of belts 32 and 8 having diced workpieces Wa inserted thereinto in the form of a stack, a pusher 34 for delivering out of cassette 33 onto belts 32 diced workpieces Wa, one workpiece at a time, beginning with workpiece Wa at the bottom of the stack, and an air cylinder 35 for driving pusher 34.

Figure 5:
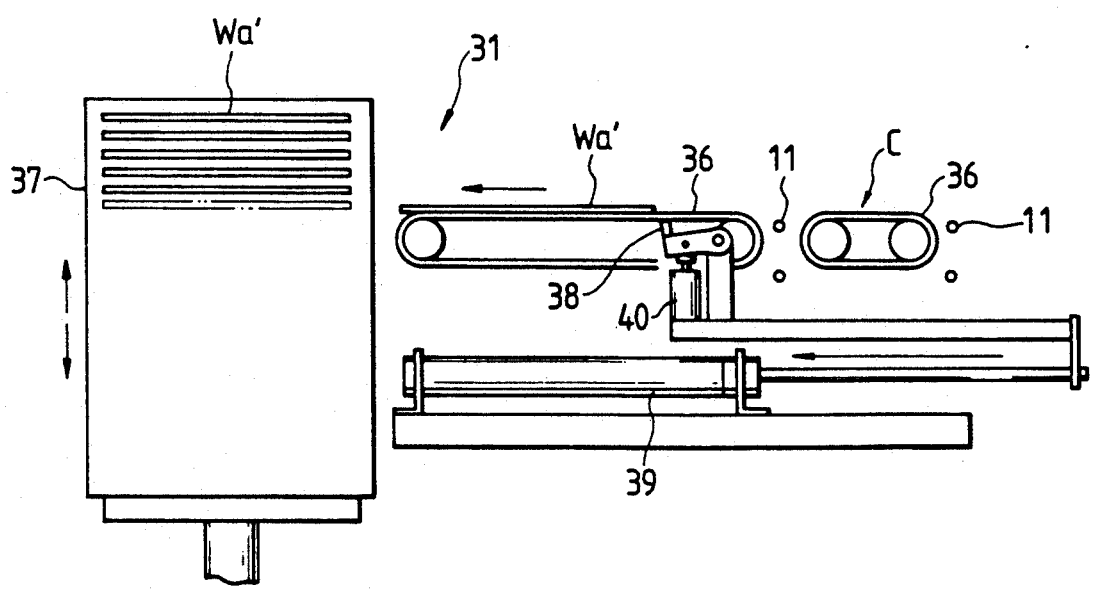
FIG. 5 is a sectional view of an unloader used in the processing system of FIG. 1.

Unloader 31, as shown in FIG. 5, includes unloading belts 36 which move perpendicularly with respect to movement of workpiece unloading belts 11, and normally are disposed below belts 11, and move above belts 11 by air cylinders (not shown) at times when belts 36 are operational, a vertically movable cassette 37 into which processed workpieces Wa' are inserted in the form of a stack, a pusher 38 for inserting processed workpiece Wa' unloaded by unloading belts 36 into cassette 37, an air cylinder 39 for driving pusher 38 forwardly or backwardly, in a direction parallel to the movement of belts 36, and an air cylinder 40 for moving pusher 38 vertically with respect to the movement of belts 36 and 11.

A controller 41, as shown in FIG. 2, is provided at UV ray applying device 3 for controlling the operation of workpiece receiving section A, UV ray applying section B, workpiece unloading section C, traverse mechanism 19, loader 30, and unloader 31 in response to instructions received from host computer 29.

Figure 6:
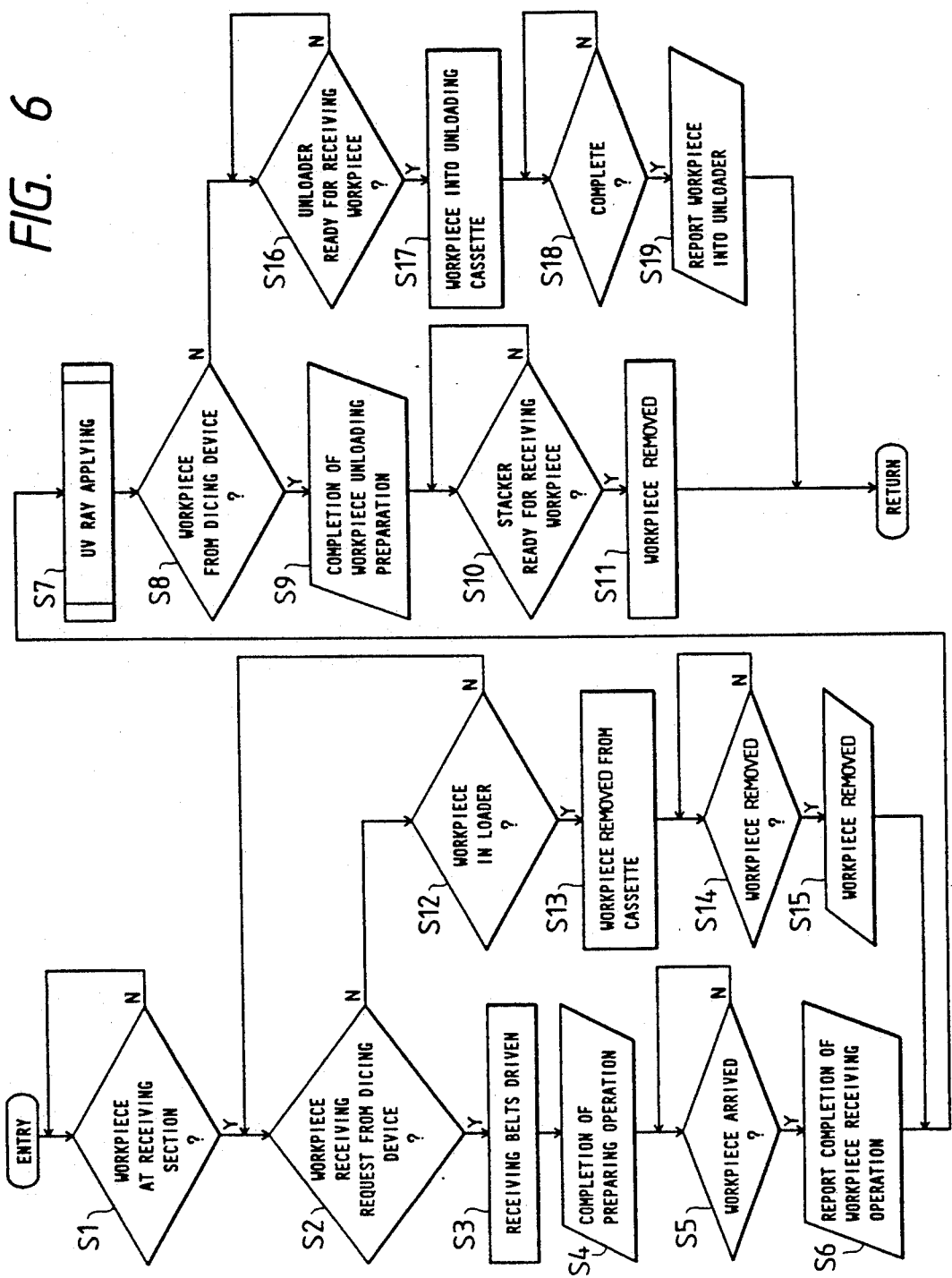
FIG. 6 is a flow chart related to the operation of the control system of FIG. 2.

The operation of UV ray applying device 3 will be described with reference to a flow chart of FIG. 6.

First, a suitable sensor (not shown) is provided at workpiece receiving section A and determines whether or not workpiece W is available at workpiece receiving section A (Step S1). If it is not available, it then determines whether or not a workpiece receivin9 request has been issued from dicing device 2 to controller 41 by host computer 29 (Step S2).

When the process line is continuously in operation, host computer 29 sends a workpiece receiving request to controller 41 for driving workpiece receiving belts 8 in UV ray applying device 3 (Step S3). In this case, workpiece supplying belts 32 are held at low position below belts 8 to facilitate the movement of belts 8. When a workpiece receiving preparatory operation with belts 8 driven, is accomplished, the fact is reported via host computer 29, to dicing device 2. Then, workpiece W is delivered from dicing device 2 to workpiece receiving belts 8 of workpiece receiving section A (Step S4).

When a suitable sensor detects the arrival of workpiece W at workpiece receiving section A (Step S5), completion of the workpiece receiving operation is reported to host computer 29 by controller 41 (Step S6). Then traverse mechanism 19 moves workpiece W from workpiece receiving section A to UV ray applying section B, subjecting workpiece W to UV rays (Step S7).

Upon completion of the UV ray application, traverse mechanism 19 moves processed workpiece W' from UV ray applying section B to workpiece unloading section C. Then, the determination of whether processed workpiece W' is originally received from dicing device 2 (Step S8), or not is made as follows: A flag is set in a register (not shown) to "1" when workpiece W is received from dicing device 2, and it is set to "0" when it is not. Thus, the determination is made based on the state of the flag set in the register. When it is determined that processed workpiece W' is received from dicing device 2, completion of the unloading preparatory operation processed workpiece W' is reported to stacker 4, via host computer 29, by controller 41 (Step S9).

When completion of the workpiece receiving preparatory operation in stacker 4 is reported, via the host computer 29, to controller 41 (Step S10), workpiece unloading belts 11 are driven to move processed workpiece W' to stacker 4 (Step S11). In this operation, workpiece unloading belts 36 is held at a low position below unloading belts 11, for facilitating the movement of workpiece W' into stacker 4.

If in Step S2, it is determined that no workpiece receiving request has been made by dicing device 2, then it is determined whether or not a workpiece Wa is available in cassette 33 of loader 30 (Step S12). If workpiece Wa is available in cassette 33, workpiece supplying belts 32 move by an air cylinder 35 upwardly to a high position above receiving belts 8, whereby workpiece Wa is unloaded from cassette 33 onto workpiece supplying belts 32 and then to workpiece receiving section A (Step S13). A suitable sensor disposed in workpiece receiving section A detects the receipt of workpiece Wa by workpiece receiving section A (Step S14). In response to the detection, cassette 33 moves vertically one step downward for unloading the next workpiece in cassette 33 (Step S15).

Upon completion of the removal of workpiece Wa from loader 30, the UV ray application is carried out in a manner described in Step S7 above.

If in Step S8, it is determined that workpiece Wa has been received from loader 30, then workpiece unloading belts 32 moves upwardly to a high position above receiving belts 8 and it is determined whether or not unloader 31 is ready for receiving processed workpiece Wa' (Step S16). A suitable sensor detects to insure that no workpiece is present at a corresponding position in the stack of cassette 37 for accommodating workpiece Wa'. When it is determined that unloader 31 is ready to receive processed workpiece Wa', processed workpiece Wa' in workpiece unloading section C is moved outwardly toward unloader 31 by workpiece unloading belts 36 held at the high position, and pushed by pusher 38 off belts 36 into cassette 37 (Step S17). When a suitable sensor detects the insertion of workpiece Wa' into cassette 37, cassette 37 of unloader 31 moves vertically, one step upward for receiving next workpiece Wa' (Step S19).

When processed workpiece Wa' originally supplied by loader 30 is inserted into cassette 37 of unloader 31 after being subjected to UV ray, the surface position of workpiece Wa' remains unchanged from the original surface position thereof originally supplied from cassette 33 of loader 30.

Figure 8:
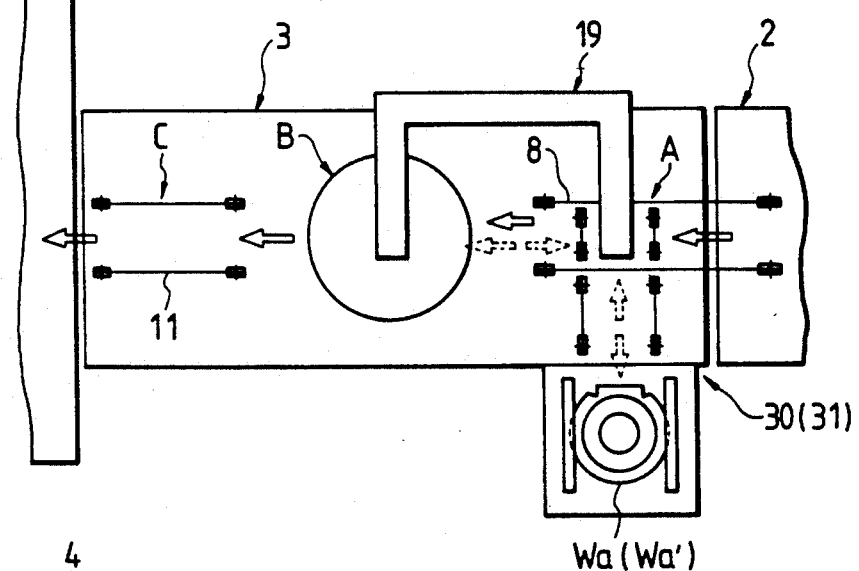
FIG. 8 is a plan view of a semiconductor wafer processing system according to a second embodiment of the present invention.
Figure 9:
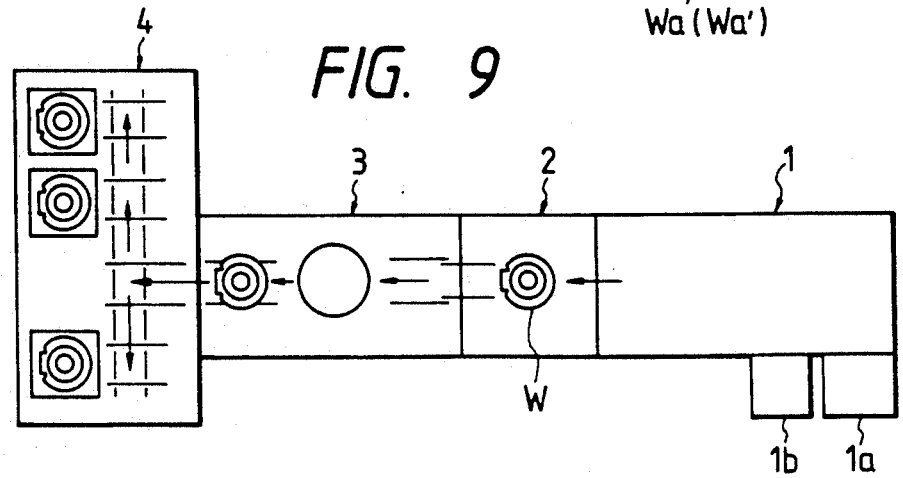
FIG. 9 is a plan view of a conventional semiconductor wafer processing system.

FIG. 8 shows a semiconductor wafer processing system according to a second embodiment of the present invention. In FIG. 8, loader 30 and unloader 31 are provided at workpiece receiving section A of UV ray applying device 3 whereby processed workpiece Wa' is brought back from UV ray applying section B to where it was originally supplied. The orientation direction of processed workpiece Wa' remains unchanged from the orientation direction of workpiece Wa as supplied from loader 31.

According to a third embodiment of the present invention, the technical concept of the invention applied to UV ray applying device 3 in the first and second embodiments is applied to dicing device 2 in that, for example, loader 30 and unloader 31 are connected to dicing device 2, forming a processing line different from the base processing line where wafer bonding device 1, dicing device 2 and UV ray applying device 3 are connected in sequence in a same manner as in the first and second embodiments.

The wafer processing system of the present invention provides several advantages over the conventional system. For an example, in situations where no workpiece receiving request is issued to a downstream processing device by a upstream processing device, waiting time of the downstream device is effectively utilized because a workpiece can be supplied to the downstream processing device directly from an auxiliary workpiece supplying device forming a processing line different from the base processing line, thus significantly reducing the waiting time of the downstream processing device. As a result, the work efficiency of the system is considerably increased.

For another example, the orientation direction of the workpiece in an auxiliary unloading device after being processed through a processing line different from the base processing line remains unchanged from the original orientation direction of the workpiece as supplied from the auxiliary supplying device. This will facilitate handling of the workpiece in subsequent process stages.

Other embodiments of the invention will be apparent to those skilled in the air from consideration of the specification and practice of the invention disclosed herein. It is intended that the specification and examples be considered as exemplary only, with a true scope and spirit of the invention being indicated by the following claims.

What is claimed is:

1. A semiconductor wafer processing system, comprising:
    a plurality of processing means forming a base processing line for performing sequential processing on a semiconductor wafer workpiece;
    sensing means for detecting the continuity of supply of workpieces to one processing means of the plurality of processing means;
    first auxiliary means disposed adjacent said one processing means and having a supplying operation responsive to the sensing means for supplying an auxiliary workpiece to said one processing means at times when continuity of supply of workpieces is interrupted and a workpiece is not being supplied by another of the plurality of processing means upstream of said one processing means, whereby a processing operation of said one processing means is continued to be used during times when a continuity of supply of workpieces is interrupted and an efficiency of use of said one processing means is increased; and
    second auxiliary means disposed adjacent said one processing means and having a receiving operation responsive to the sensing means for receiving the auxiliary workpiece processed by said one processing means, said receiving being conducted in a direction different than the direction of the base processing line extending between said one processing means and another of the plurality of processing means downstream of said one processing means.

2. The semiconductor wafer processing system of claim 1, wherein the workpiece has a frame and includes a semiconductor wafer bonded by an adhesive to the frame and said one processing means includes exposing means for exposing the workpiece to a light beam for reducing the bonding strength between the wafer and the frame to facilitate removal of at least a portion of the wafer from the frame.

3. The semiconductor wafer processing system of claim 1, wherein;
    the first auxiliary means is disposed at a spaced location from the base processing line and includes means for supplying the auxiliary workpiece in a first direction transverse the base processing line; and
    the second auxiliary means is disposed to receive the auxiliary workpiece in a second direction opposite the first direction at the same spaced location as the first auxiliary means.

4. The semiconductor wafer processing system of claim 1, wherein;
    the first auxiliary means is operative to supply said auxiliary workpiece having an orientation in a first direction to said one processing means; and
    said second auxiliary means is operative to receive the auxiliary workpiece having an orientation in a second direction after being processed by said one of the plurality of processing means, said second direction being identical to said first direction.

5. The semiconductor wafer processing system of claim 1, wherein the plurality of processing means forming a base processing line for processing a workpiece in sequence includes at least a semiconductor wafer bonding device, a dicing device and an ultraviolet ray applying device.

6. A semiconductor wafer processing device including a line of a plurality of processing means forming a base processing line for performing sequential processing of workpieces, comprising:
    predetermined processing means for processing a workpiece;
    sensing means for detecting continuity of supply of workpieces to said predetermined processing means;
    first auxiliary means disposed adjacent said predetermined processing means and having a supplying operation responsive to the sensing means for supplying an auxiliary workpiece to said predetermined processing means at times when continuity of supply of workpieces is interrupted and a workpiece is not being supplied by another of the plurality of processing means upstream of said predetermined processing means, whereby a processing operation of said predetermined processing means is continued to be used during times when a continuity of supply of workpieces is interrupted and an efficiency of use of said predetermined processing means is increased; and
    second auxiliary means disposed adjacent said predetermined processing means and having a receiving operation responsive to the sensing means for receiving the auxiliary workpiece processed by said predetermined processing means, said receiving being conducted in a direction different than the direction of the base processing line extending between said predetermined processing means and another of the plurality of processing means downstream of said predetermined processing means.

* * * * *